(12) United States Patent
Chen

(10) Patent No.: US 10,278,315 B2
(45) Date of Patent: Apr. 30, 2019

(54) SHIELDING CASE FRAME

(71) Applicant: Shenzhen Sunway Communication Co., Ltd., Shenzhen (CN)

(72) Inventor: Gan Chen, Shenzhen (CN)

(73) Assignee: SHENZHEN SUNWAY COMMUNICATION CO., LTD., Shenzhen (CN)

( * ) Notice: Subject to any disclaimer, the term of this patent is extended or adjusted under 35 U.S.C. 154(b) by 81 days.

(21) Appl. No.: 15/540,247

(22) PCT Filed: Nov. 28, 2016

(86) PCT No.: PCT/CN2016/107497
§ 371 (c)(1),
(2) Date: Jun. 27, 2017

(87) PCT Pub. No.: WO2018/049731
PCT Pub. Date: Mar. 22, 2018

(65) Prior Publication Data
US 2018/0338395 A1    Nov. 22, 2018

(30) Foreign Application Priority Data

Sep. 14, 2016   (CN) .......................... 2016 2 1059036

(51) Int. Cl.
*H05K 9/00* (2006.01)
*H05K 1/18* (2006.01)

(52) U.S. Cl.
CPC ........... *H05K 9/0032* (2013.01); *H05K 1/181* (2013.01); *H05K 2201/10371* (2013.01); *H05K 2201/10424* (2013.01)

(58) Field of Classification Search
CPC .......................... H05K 9/0043; H05K 9/0032
See application file for complete search history.

(56) References Cited

U.S. PATENT DOCUMENTS

| 5,742,004 A * | 4/1998 | Greco ................. H05K 9/0032 174/372 |
| 5,917,708 A * | 6/1999 | Moran ................ H05K 9/0032 174/372 |
| 6,552,261 B2 * | 4/2003 | Shlahtichman ...... H05K 9/0032 174/384 |
| 7,488,902 B2 * | 2/2009 | English ............... H05K 9/0032 174/377 |
| 9,462,732 B2 * | 10/2016 | Robinson ............ H05K 9/0032 |

(Continued)

FOREIGN PATENT DOCUMENTS

| CN | 203327478 U | 12/2013 |
| CN | 104080323 A | 10/2014 |

(Continued)

*Primary Examiner* — Hung V Ngo
(74) *Attorney, Agent, or Firm* — Ming Chow; Sinorica, LLC

(57) ABSTRACT

A shielding case frame has a frame main body and a suction structure. The suction structure is connected with the frame main body through at least one precut structure. The precut structure has extension parts arranged on the suction structure, a pressing part connected with the extension parts and a precut part. The pressing part is connected with the frame main body through the precut part. A bottom surface or/and a top surface of the precut part is provided with a precut groove.

10 Claims, 3 Drawing Sheets

(56) References Cited

U.S. PATENT DOCUMENTS

| | | | | |
|---|---|---|---|---|
| 2008/0080160 A1* | 4/2008 | English | ................ | H05K 9/0032 |
| | | | | 361/818 |
| 2012/0281386 A1* | 11/2012 | Kim | .................... | H05K 9/0028 |
| | | | | 361/818 |
| 2013/0027893 A1* | 1/2013 | Vinokur | ............... | H05K 9/0032 |
| | | | | 361/748 |
| 2013/0033843 A1* | 2/2013 | Crotty, Jr. | ............ | H05K 9/0032 |
| | | | | 361/807 |
| 2014/0218851 A1* | 8/2014 | Klein | ....................... | H05K 3/20 |
| | | | | 361/679.02 |
| 2016/0113161 A1* | 4/2016 | Ball | .................... | H05K 9/0032 |
| | | | | 174/381 |
| 2018/0263143 A1* | 9/2018 | Chang | .................. | H05K 9/0032 |
| 2018/0263144 A1* | 9/2018 | Crotty, Jr. | ............ | H05K 9/0032 |

FOREIGN PATENT DOCUMENTS

| | | | |
|---|---|---|---|
| CN | 205005342 U | 1/2016 | |
| JP | 4581857 B2 | 11/2010 | |
| TW | 200847915 A | 12/2008 | |

\* cited by examiner

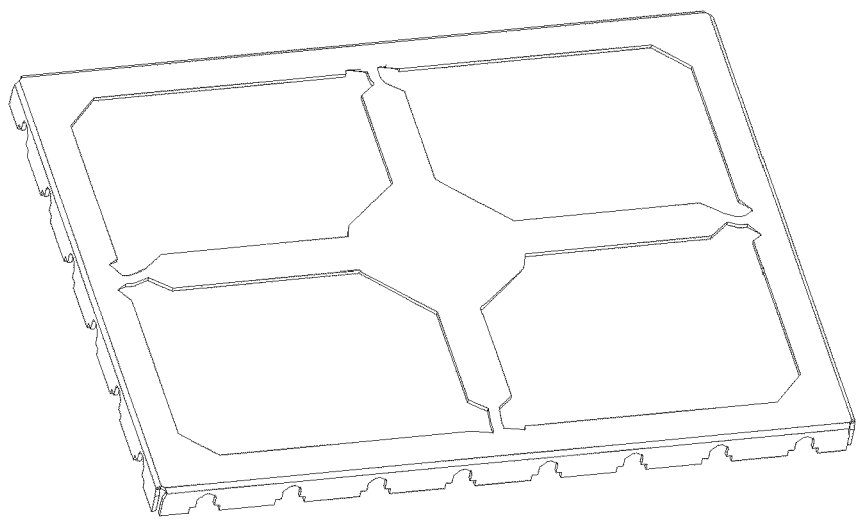
--Prior Art-- FIG. 1a
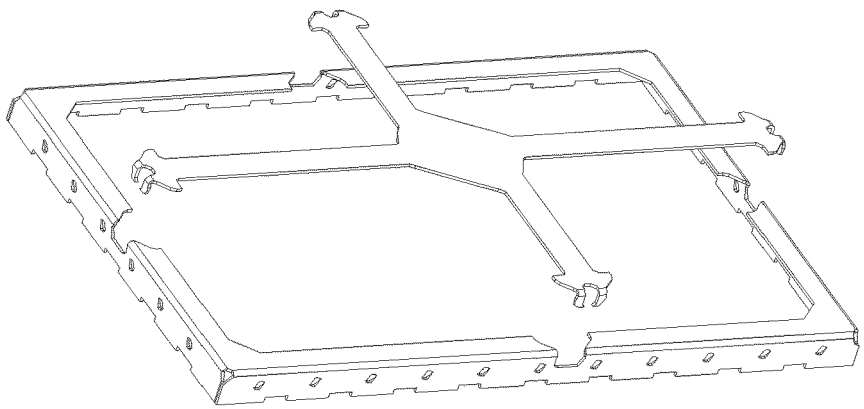
--Prior Art-- FIG. 1b
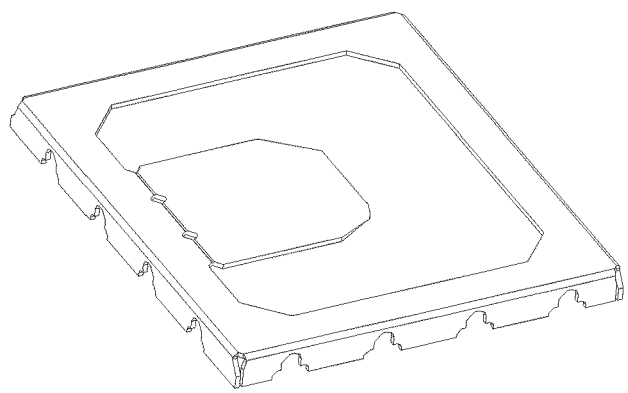
--Prior Art-- FIG. 1c

SHIELDING CASE FRAME

TECHNICAL FIELD

The invention relates to shielding cases, in particular to a shielding case frame.

DESCRIPTION OF RELATED ART

For protecting electronic products against electromagnetic interference, all parts need to be shielded from interference through shielding cases. For conveniently repairing internal parts in the shielding cases, common shielding cases on the market are of a two-piece structure which having a frame and a cover. Since the shielding case frames need to be mounted on circuit boards through the surface mount technology (SMT), suction cups and adjoining structures of suction cups and frame need to be mounted on the frames.

However, in order to reduce the weight of products and facilitate subsequent repairing, the suction cups and the adjoining structures on the shielding case frames need to be removed after SMT. In the prior art, three common designs for conveniently removing the suction cups and the adjoining structures are provided; according to the first design shown in FIG. 1a, the suction cup and frame adjoining structure is a connecting strip which is narrower than the suction cup extension parts; according to the second design shown in FIG. 1b, precutting treatment is conducted on molds at the junctions of suction cup extension parts and the frame, and when the suction cup is lifted upwards, two clamping jaws at the each junction draw close to the hollow area to deform, so that the suction cup and the adjoining structure are separated from the frame; according to the third design shown in FIG. 1c, the suction cup adjoins to the frame, and precutting treatment is conducted on the junction. The three designs all have respective limitation, as for the first design, a shearing tool is needed for shearing one by one after SMT, the production efficiency is low, and sufficient spaces need to be reserved at the shearing positions to prevent interference between the tool and the parts below and damage the parts during shearing. As for the second design, since the structures have already been cut off from the molds, the design and machining requirements for the molds are high, and the mold cost is high. The third design is only suitable for shielding cases with small sizes, and if the size of the frame is large, the frame can be poor in strength and is prone to deformation before SMT.

Therefore, for solving the problems of the existing design, it is necessary to provide a novel shielding case frame with a suction cup capable of being removed conveniently.

BRIEF SUMMARY OF THE INVENTION

For solving the technical problems, the invention provides a novel shielding case frame with conveniently removable suction cup.

According to the technical scheme adopted by the invention for solving the above technical problems, the shielding case frame comprises a frame main body and a suction structure, wherein the suction structure is connected with the frame main body through at least one precut structure; the precut structure comprises extension parts arranged on the suction structure, a pressing part connected with the extension parts, and a precut part; the pressing part is connected with the frame main body through the precut part, and the bottom surface or/and the top surface of the precut part is provided with a precut groove.

Furthermore, the longitudinal section of the precut part is in a step shape.

Furthermore, the number of the extension parts is two, the two extension parts are arranged on two opposite sides of the pressing part respectively, and an accommodation space is formed between the two extension parts; the pressing part is accommodated in the accommodation space.

Furthermore, the sectional areas of the regions, connected with the pressing part, of the extension parts are smaller than the sectional areas of other regions of the extension parts.

Furthermore, the suction structure is in a cross shape and comprises a suction cup, the suction cup is arranged at the crossed position of the cross-shaped suction structure, and the precut structures are located at the four ends of the cross-shaped suction structure.

Furthermore, the suction cup is round.

Furthermore, the pressing part and the suction structure are located on the same plane.

Furthermore, pressing part comprises a first pressing part body and a second pressing part body, the first pressing part body is connected with the precut part, the second pressing part body is connected with the first pressing part body, an included angle is formed between the first pressing part body and the second pressing part body, and the included angle is a right angle or an acute angle or an obtuse angle.

Furthermore, the extension parts are connected with the first pressing part body.

Furthermore, a through hole is set in the second pressing part body.

The invention has the beneficial effects that the suction structure can be removed rapidly and conveniently by pressing the pressing parts with fingers without a special tool; the structure is simple, machining is convenient, and the production cost is low; the suction structure can be used for supporting the main body of the shielding case frame before being dismantled, so that the overall strength of the shielding case frame is improved, and the shielding case frame is not prone to deformation.

BRIEF DESCRIPTION OF THE SEVERAL VIEWS OF THE DRAWINGS

FIG. 1a is a schematic diagram of a shielding case frame in the prior art;

FIG. 1b is a schematic diagram of a second shielding case frame in the prior art;

FIG. 1c is a schematic diagram of a third shielding case frame in the prior art;

DESCRIPTION OF THE MARKS

Figure 2:
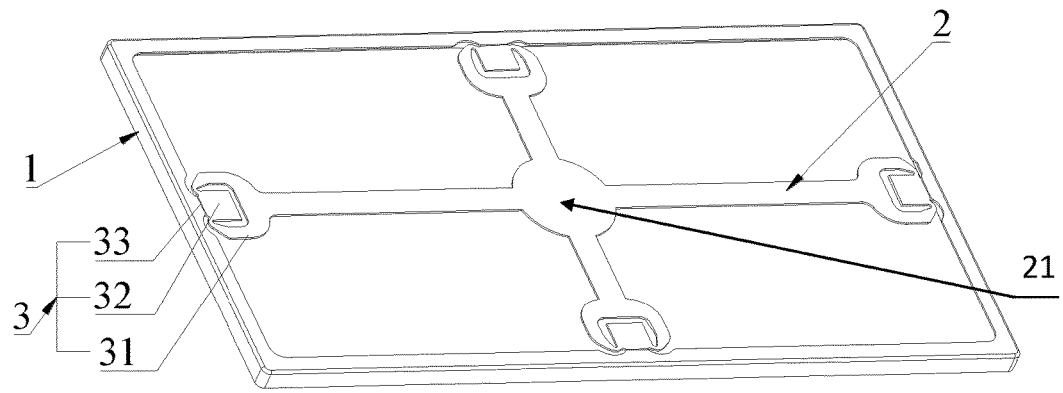
FIG. 2 is a schematic diagram of a shielding case frame in the first embodiment of the invention.

1. Frame main body;
2. Suction structure;
21. Suction cup;

3. Precut structure;
31. Extension part;
32. Pressing part;
321. First pressing part body;
322. Second pressing part body;
3221. Through hole;
33. Precut part;
34. Connection region;
4. Notch

DETAILED DESCRIPTION OF THE INVENTION

A detailed description of the technical contents, purposes and effects of the invention is given with embodiments and accompanying drawings as follows.

The key conception of the invention lies in that a precut structure is designed, so that a suction structure can be rapidly removed without a special tool.

Please see FIGS. 2-7, a shielding case frame comprises a frame main body 1 and a suction structure 2, wherein the suction structure 2 is connected with the frame main body 1 through at least one precut structure 3; the precut structure 3 comprises extension parts 31 arranged on the suction structure 2, a pressing part 32 connected with the extension parts 31, and a precut part 33; the pressing part 32 is connected with the frame main body 1 through the precut part 33, and the bottom surface or/and the top surface of the precut part 33 is provided with a precut groove.

Based on the above description, the invention has the beneficial effects that the suction structure can be removed rapidly and conveniently by pressing the pressing parts with fingers without a special tool; the structure is simple, machining is convenient, and the production cost is low; the suction structure can be used for supporting the main body of the shielding case frame before being dismantled, so that the overall strength of the shielding case frame is improved, and the shielding case frame is not prone to deformation.

Furthermore, the longitudinal section of the precut part 33 is in a step shape.

It can be known from the above description that the precut part is not definitely provided with the precut groove, the precut effect can still be realized by setting the precut part to be in the step shape, and the suction structure can be rapidly separated from the frame main body.

Furthermore, the number of the extension parts 31 is two, the two extension parts 31 are arranged on two opposite sides of the pressing part 32 respectively, and an accommodation space is formed between the two extension parts 31; the pressing part 32 is accommodated in the accommodation space.

It can be known from the above description that by arranging the two extension parts connected with the pressing part, the stability of the precut structure can be improved easily, and the situation that the suction structure is separated from the frame main body before SMT due to mistaken triggering of the pressing part is avoided.

Furthermore, the sectional areas of the regions, connected with the pressing part 32, of the extension parts 31 are smaller than the sectional areas of other regions of the extension parts 31.

It can be known from the above description that since the sectional areas of the regions, connected with the pressing part, of the extension parts are small, the regions can be distorted, and accordingly the precut structure can be separated from the frame main body more easily.

Furthermore, the suction structure 2 is in a cross shape and comprises a suction cup 21, the suction cup 21 is arranged at the crossed position of the cross-shaped suction structure 2, and the precut structures 3 are located at the four ends of the cross-shaped suction structure 2.

It can be known from the above description that the cross-shaped suction structure can provide large supporting force for the frame main body, so that the influence of deformation of the frame main body on subsequent machining is avoided.

Furthermore, the suction cup 21 is round.

It can be known from the above description that suction of SMT equipment can be better facilitated through the round suction cup 21.

Furthermore, the pressing part 32 and the suction structure 2 are located on the same plane.

It can be known from the above description that the pressing part and the suction structure are located on the same plane, and thus the shielding case frame can be stacked and stored easily.

Furthermore, the pressing part 32 comprises a first pressing part body 321 and a second pressing part body 322, the first pressing part body 321 is connected with the precut part 33, the second pressing part body 322 is connected with the first pressing part body 321, an included angle is formed between the first pressing part body 321 and the second pressing part body 322, and the included angle is a right angle or an acute angle or an obtuse angle.

Furthermore, the extension parts 31 are connected with the first pressing part body 321.

It can be known from the above description that the pressing part is divided into two parts, and thus the suction structure can be removed more easily and conveniently.

Furthermore, a through hole 3221 is set in the second pressing part body 322.

It can be known from the above description that a special tool positioned through the through holes can be designed, an operator can trigger all the precut structures on the shielding case frame at the same time through the tool, and thus the removing efficiency of the suction structure is further improved.

First Embodiment

Figure 3:
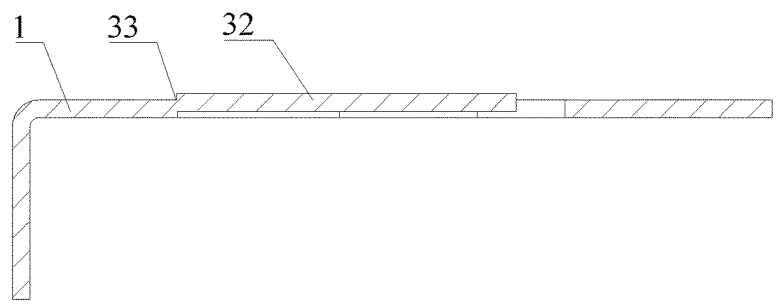
FIG. 3 is a sectional schematic diagram of a step-shaped precut part in the first embodiment of the invention.

Please see FIGS. 2-5 for the first embodiment of the utility mode, as is shown in FIG. 2, a shielding case frame comprises a frame main body 1 and a suction structure 2, wherein the suction structure 2 is connected with the frame main body 1 through at least one precut structure 3; the precut structure 3 comprises extension parts 31 arranged on the suction structure 2, a pressing part 32 connected with the extension parts 31, and a precut part 33; the pressing part 32 is connected with the frame main body 1 through the precut part 33, and the bottom surface or/and the top surface of the precut part 33 is provided with a precut groove. As is shown in FIG. 3, the precut part 33 can also not be provided with the precut groove, the precut part 33 can be set to be in a step shape, namely the longitudinal section of the precut part is in a step shape, and both the step and the precut groove can achieve the precut effect. Please see FIG. 2, in the embodiment, the suction structure 2 is in a cross shape and comprises a round suction cup 21, the suction cup 21 is arranged at the crossed position of the cross-shaped suction structure 2, and the precut structures 3 are located at the four ends of the cross-shaped suction structure 2. The cross-shaped suction structure 2 can provide large supporting force for the frame main body 1, so that the influence of deformation of the frame main body 1 on subsequent machining is avoided.

Figure 4:
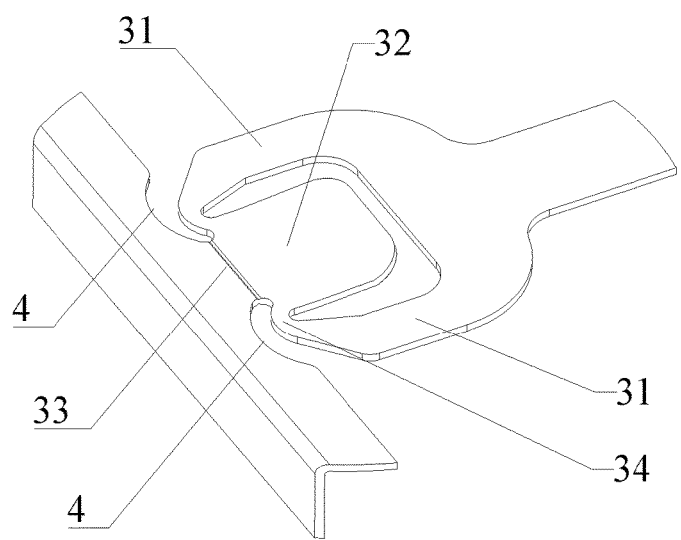
FIG. 4 is a schematic diagram of a precut structure in the first embodiment of the invention.
Figure 5:
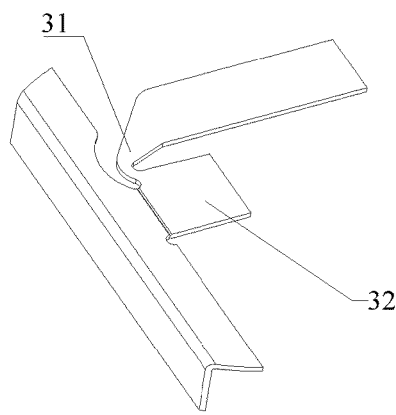
FIG. 5 is a schematic diagram of a precut structure with a single extension part in the first embodiment of the invention.

Please see FIG. 2 and FIG. 4, the number of the extension parts 31 can be two, the two extension parts 31 are arranged on two opposite sides of the pressing part 32 respectively, and an accommodation space is formed between the two extension parts 31; the pressing part 32 is accommodated in the accommodation space. It should be understood that the extension parts 31 do not definitely have radians as is shown in the FIGs. In addition, as is shown in FIG. 5, it is feasible that only one extension part 31 is arranged and connected with the pressing part 32.

Please see FIG. 2 and FIG. 4, the pressing part 32 and the suction structure 2 are located on the same plane. For optimization, the sectional areas of the regions, connected with the pressing part 32, of the extension parts 31 are smaller than the sectional areas of other regions of the extension parts 31; in the FIGs, it can be clearly seen that the widths of the connection regions 34 are obviously smaller than the widths of other regions of the extension parts 31, the sectional areas of the connection regions 34 are smaller than the sectional areas of other regions of the extension parts 31 accordingly, the connection regions 34 can be distorted more easily through the design, and thus the precut structures 3 can be separated from the frame main body 1 more easily.

For further optimization, the two ends of the junction between the frame main body 1 and the precut part 33 are each provided with an arc-shaped notch 4 (as is shown in FIG. 4), and the notches 4 are used for eliminating stress left on the frame main body 1 after the precut part 33 fractures, and thus the service life of the shielding case frame is prolonged easily.

Second Embodiment

Figure 6:
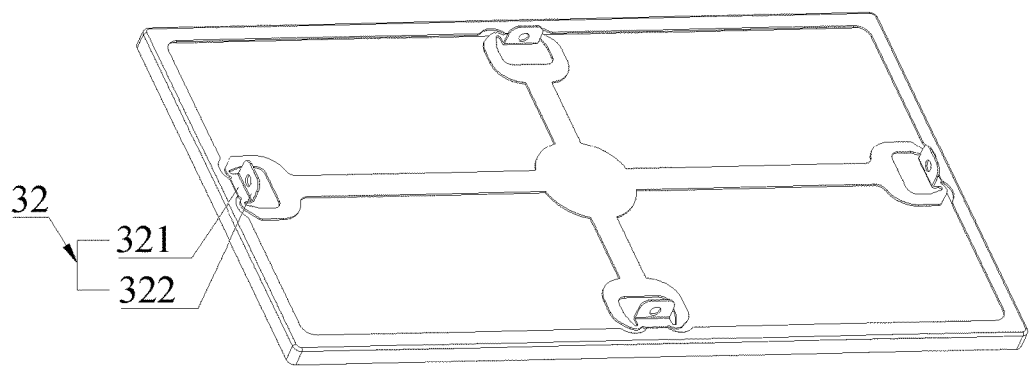
FIG. 6 is a schematic diagram of a shielding case frame in the second embodiment of the utility mode.
Figure 7:
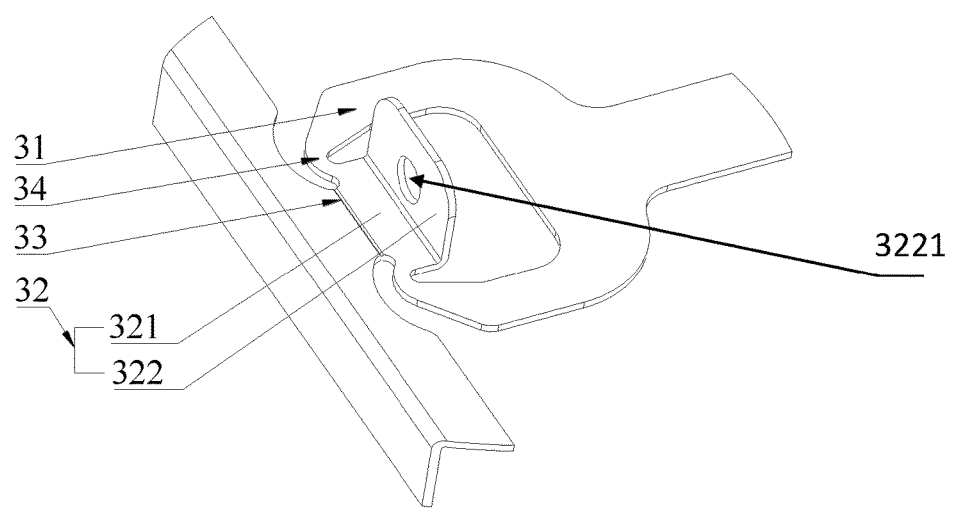
FIG. 7 is a schematic diagram of a precut structure in the second embodiment of the invention.

Please see FIG. 6 and FIG. 7, the second embodiment of the invention refers to the improvement of the pressing part based on the first embodiment and is different from the first embodiment in that the pressing part 32 is not a flat plate and comprises a first pressing part body 321 and a second pressing part body 322, wherein the first pressing part body 321 is connected with the precut part 33, the second pressing part body 322 is connected with the first pressing part body 321, an included angle is formed between the first pressing part body 321 and the second pressing part body 322, and the included angle is a right angle or an acute angle or an obtuse angle. The extension parts 31 are connected with the first pressing part body 321. By dividing the pressing part 32 into two non-coplanar parts, the suction structure 2 can be removed more easily and conveniently, and the production efficiency can be further improved.

For optimization, a through hole 3221 is set in the second pressing part body 322. A designer can design a special tool (such as a four-claw hook) capable of being positioned through the through holes, an operator can trigger all the precut structures 3 on the shielding case frame at the same time through the tool, all the precut structures 3 on the shielding case frame are made to fracture at the same time, the suction structure 2 is separated from the frame main body 1 accordingly, and the removing speed of the suction structure 2 is further increased.

In conclusion, by adoption of the shielding case frame provided by the invention, the suction structure can be removed rapidly and conveniently by pressing the pressing parts with fingers without the special tool; the structure is simple, machining is convenient, and the production cost is low; the shielding case frame is high in overall strength and not prone to deformation.

The foregoing description only refers to embodiments of the invention, and the patent scope of the invention is not limited to the foregoing description; all equivalent transformations made according to contents of the description and drawings of the invention and all direct or indirect use to relevant technical fields are within the patent protection scope of the invention without exception.

The invention claimed is:

1. A shielding case frame, comprising a frame main body and a suction structure, characterized in that the suction structure is connected with the frame main body through at least one precut structure, wherein the precut structure comprises extension parts arranged on the suction structure, a pressing part connected with the extension parts, and a precut part, the pressing part is connected with the frame main body through the precut part, and the bottom surface or/and the top surface of the precut part is provided with a precut groove.

2. The shielding case frame according to claim 1, characterized in that the longitudinal section of the precut part is in a step shape.

3. The shielding case frame according to claim 1, characterized in that the number of the extension parts is two, the two extension parts are arranged on two opposite sides of the pressing part respectively, and an accommodation space is formed between the two extension parts; the pressing part is accommodated in the accommodation space.

4. The shielding case frame according to any of claims 1-3, characterized in that sectional areas of regions, connected with the pressing part, of the extension parts are smaller than sectional areas of other regions of the extension parts.

5. The shielding case frame according to claim 4, characterized in that the suction structure is in a cross shape and comprises a suction cup, the suction cup is arranged at the crossed position of the cross-shaped suction structure, and the precut structures are located at the four ends of the cross-shaped suction structure.

6. The shielding case frame according to claim 5, characterized in that the suction cup is round.

7. The shielding case frame according to any of claims 1-3 and claims 5-6, characterized in that the pressing part and the suction structure are located on the same plane.

8. The shielding case frame according to any of claims 1-3 and claims 5-6, characterized in that the pressing part comprises a first pressing part body and a second pressing part body, the first pressing part body is connected with the precut part, the second pressing part body is connected with the first pressing part body, an included angle is formed between the first pressing part body and the second pressing part body, and the included angle is a right angle or an acute angle or an obtuse angle.

9. The shielding case frame according to claim 8, characterized in that the extension parts are connected with the first pressing part body.

10. The shielding case frame according to claim 9, characterized in that a through hole is set in the second pressing part body.

* * * * *